(12) United States Patent
Henzler et al.

(10) Patent No.: US 7,900,114 B2
(45) Date of Patent: Mar. 1, 2011

(54) ERROR DETECTION IN AN INTEGRATED CIRCUIT

(75) Inventors: Stephan Henzler, Taufkirchen (DE); Martin Wirnshofer, Munich (DE); Dominik Lorenz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 188 days.

(21) Appl. No.: 12/395,490

(22) Filed: Feb. 27, 2009

(65) Prior Publication Data

US 2010/0223520 A1 Sep. 2, 2010

(51) Int. Cl.
*G01R 31/28* (2006.01)
(52) U.S. Cl. .................. 714/744; 714/731; 714/746
(58) Field of Classification Search ............. 369/59.19; 365/233.15; 315/291; 375/372; 713/600; 714/744, 731, 746
See application file for complete search history.

(56) References Cited

U.S. PATENT DOCUMENTS 6,118,745 A * 9/2000 Hutchins et al. ......... 369/59.19
6,160,755 A * 12/2000 Norman et al. ......... 365/233.15
6,891,339 B2 * 5/2005 Ribarich et al. ............. 315/291
2004/0141576 A1 * 7/2004 Sonoda ........................ 375/372
2005/0262376 A1 * 11/2005 McBain ...................... 713/600
2007/0288798 A1  12/2007 Flautner et al.

FOREIGN PATENT DOCUMENTS

| DE | 102005049232 A | 4/2007 |
| WO | WO2004084070 A1 | 9/2004 |
| WO | WO2007045202 A1 | 4/2007 |

OTHER PUBLICATIONS

Austin et al, "Making Typical Silicon Matter with Razor", IEEE Computer Socitey, Mar. 2004, pp. 41-49.

* cited by examiner

*Primary Examiner*—David Ton
(74) *Attorney, Agent, or Firm*—Lee & Hayes, PLLC

(57) ABSTRACT

An electronic device includes an integrated circuit operating on the basis of an operating clock signal, an error detection circuit and a control circuit coupled to the error detection circuit. The control circuit is configured to increase the frequency of the operating clock signal starting from a nominal operating frequency of the integrated circuit, to evaluate a frequency increment at which an error is detected by the error detection circuit, and to reset the frequency of the operating clock signal to said nominal frequency.

25 Claims, 7 Drawing Sheets

ERROR DETECTION IN AN INTEGRATED CIRCUIT

FIELD OF THE INVENTION

The present invention relates to devices and methods using error detection in an integrated circuit.

BACKGROUND OF THE INVENTION

In semiconductor electronics, it is known to adjust operating parameters of digital circuits, e.g. based on static logic, in such a way that the circuit operates with an operating frequency which is as high as possible and with a supply voltage which is as low as possible. However, due to process variations in manufacturing the integrated semiconductor circuit and due to performance degradations, e.g. induced by aging, it is typically necessary to introduce timing margins, which ensure that the circuit is operable even under a worst case scenario, e.g. in the case of strong performance degradations due to aging and process variations.

Accordingly, there is a need for efficient methods and devices, which allow for evaluating timing margins in an integrated circuit.

SUMMARY OF THE INVENTION

According to one embodiment of the invention, an electronic device is provided which comprises an integrated circuit operating on the basis of an operating clock signal, an error detection circuit, and a control circuit coupled to the error detection circuit. The control circuit is configured to increase a frequency of the operating clock signal starting from a nominal operating frequency of the integrated circuit, to evaluate a frequency increment at which an error is detected by the error detection circuit, and to reset the frequency of the operating clock signal to the nominal frequency.

DETAILED DESCRIPTION OF EMBODIMENTS

In the following, embodiments of the invention will be explained in further detail and with reference to the accompanying drawings. It is to be understood that the description is not to be taken in a limiting sense, but is made only for the purpose of illustrating the general principles of the invention. Further, it is to be understood that the scope of the invention is only defined by the claims and is not intended to be limited by the embodiments and examples described hereinafter.

Throughout the description and the drawings, similar or corresponding components are designated by the same reference signs. Here, it is to be understood that the structures as illustrated are merely illustrative and schematic and that any shown or described direct connection or coupling between two functional blocks, devices, components, or other physical or functional elements could also be implemented by indirect connection or coupling.

The embodiments as described hereinafter relate to methods and electronic devices which allow for evaluating timing margins. The electronic devices may be implemented on the basis of one or more integrated circuits. In some embodiments, the illustrated functions may be implemented in a single integrated circuit.

Figure 1:
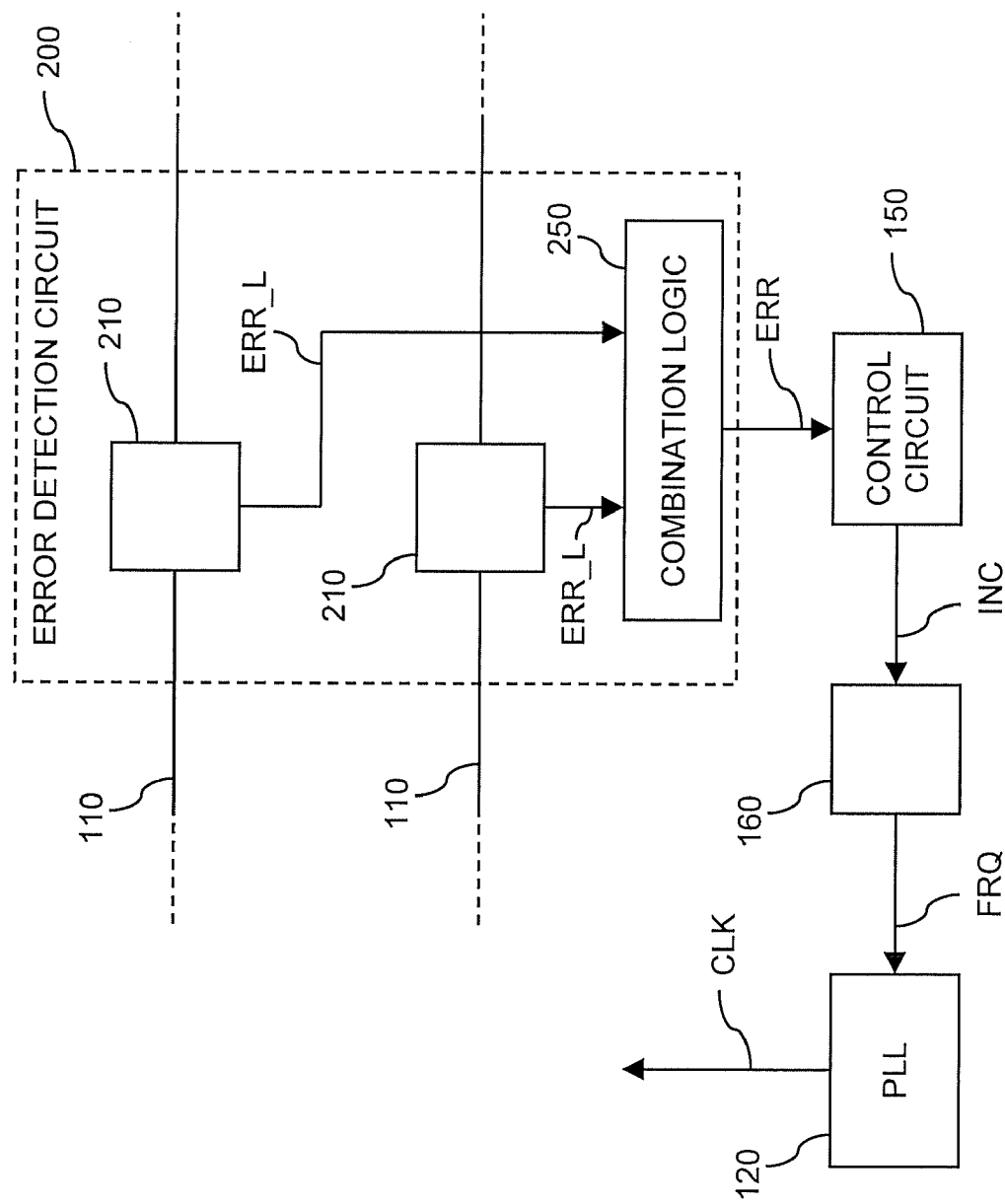
FIG. 1 schematically illustrates circuitry in an electronic device according to an embodiment of the invention.

FIG. 1 schematically illustrates circuitry in an electronic device according to an embodiment of the invention. By way of example, the circuitry is illustrated as including two signal paths 110. In the figure, only a portion of the signal paths 110 is illustrated and it is to be understood that typically a signal path will pass through a plurality of circuit elements and may extend between a signal input and a signal output of an integrated circuit. Further, it is to be understood that a different number of the signal paths 110 could be provided, e.g. only one signal path 110 or more than two signal paths 110.

As further illustrated, the circuitry includes a clock signal source 120. In the illustrated embodiment, the clock signal source 120 is implemented on the basis of a phase-locked-loop (PLL). In other embodiments, the clock signal source may be implemented on the basis of a delay-locked-loop (DLL). The clock signal source 120 generates an operating clock signal CLK for the integrated circuit which includes the signal paths 110. The frequency of the operating clock signal CLK as output by the clock signal source 120 is set on the basis of a frequency control signal FRQ. According to an embodiment, the clock signal source 120 is digitally implemented, e.g. on the basis of a digital PLL or a digital DLL, and the frequency control signal FRQ is a digital signal. This allows for a fine-grained tuning of the frequency of the operating clock signal CLK. The frequency of the operating clock signal CLK may be set to correspond to a nominal operating frequency specified for the integrated circuit, e.g. in a data sheet or the like.

The circuitry further includes a frequency control register 160 which stores a signal value representing the frequency to be adjusted by the clock signal source 120.

As further illustrated, the circuitry comprises an error detection circuit 200. The error detection circuit 200 is configured to detect an error which may occur in the integrated circuit with the signal paths 110. The error detection circuit 200 generates an error signal ERR which indicates whether an error is detected by the error detection circuit 200.

In the illustrated embodiment, the error detection circuit 200 is implemented on the basis of error detectors 210 each coupled to a corresponding one of the signal paths 110. Each of the error detectors 210 generates a local error signal ERR_L, which indicates the detection of an error in the respective signal path 110. The error detection circuit 200 further includes a combination logic 250, which receives the local error signals ERR L from the individual error detectors 210. The combination logic 250 generates the error signal ERR on the basis of a logic combination of the individual local error signals ERR_L. In an embodiment, the combination logic may include a logic OR-gate. That is to say, the error signal ERR may be generated as indicating an error if at least one of the individual local error signals ERR_L indicates an error. The local error signals ERR_L and the error signal ERR may be digital signals. For example, a binary value "1" may indicate the detection of an error, whereas a binary value "0" indicates that no error is detected, or vice versa. However, it is to be understood that other types of signaling are possible as well, and that the detailed implementation of the combination logic 250 may be suitably adapted to the type of signaling in the local error signals ERR_L and the error signal ERR.

The circuitry of FIG. 1 further includes a control circuit 150 which receives the error signal ERR from the error detection circuit 200. The control circuit 150 is configured to increase the frequency of the operating clock signal CLK starting from the nominal operating frequency and to evaluate a frequency increment, i.e. the difference of the increased frequency to the nominal operating frequency, at which an error is detected by the error detection circuit 200. The frequency of the operating clock signal CLK is then reset to the nominal operating frequency. In other words, the control circuit 150 accomplishes a temporary increase of the frequency. In some embodiments, the control circuit 150 may also accomplish a temporary decrease of the frequency or stop the operating clock signal so as to maintain a specific average frequency, e.g. an average frequency substantially corresponding to the nominal frequency.

In the circuitry of FIG. 1, the control circuit 150 accomplishes the temporary increase of the frequency by writing into the frequency control register 160. For this purpose, the control circuit 150 supplies a digital increment signal INC to the frequency control register 160. According to an embodiment, the frequency control register 160 includes a first portion which is not affected by the increment signal INC, e.g. a number of most significant bits. This portion may correspond to the nominal frequency of the operating clock signal CLK. A second portion of the frequency control register 160 is controlled by the increment signal INC and may include a number of least significant bits. In other embodiments, different ways of controlling the frequency increase may be adopted. For example, the control circuit 150 may directly control the clock signal source 120 or may overwrite the complete frequency control register 160. The state of the frequency control register 160 before the frequency increase may be stored in a shadow register, which allows for resetting the frequency in a fast and reliable manner.

As mentioned above, the control circuit 150 receives the error signal ERR from the error detection circuit 200. If the error signal ERR indicates that an error is detected, the corresponding frequency increment is evaluated. The evaluated frequency increment is representative of whether timing margins are met by the integrated circuit or not. The control circuit 150 may therefore generate an output signal OUT on the basis of the evaluated frequency increment. For example, the output signal OUT may digitally encode the evaluated frequency increment so as to be used by further processing stages, such as a central processing unit (CPU) of a computer system, software running on a computer system, e.g. an operating system, or the like, which may then use the evaluated timing margins. Further, the control circuit 150 may also be configured to compare the evaluated frequency increment to a predefined frequency margin. In this case, the output signal OUT may indicate whether the evaluated frequency increment is less than the predefined frequency margin or not, i.e. whether the integrated circuit is still operated within a predefined frequency margin or not. On the basis of the output signal OUT, a warning signal may be generated so as to indicate to a user or an operator of the electronic device that the integrated circuit is not operated within the predefined frequency margin, i.e. that timing margins as specified for the integrated circuit are no longer met. The output signal may also be a value representing an effective age of the integrated circuit, a measure of expected life time, or the like. The user or operator may then replace the integrated circuit before a failure of the electronic device or of an entire system including the electronic device occurs. Further, if the evaluation in the control circuit 150 indicates that the predefined frequency margin is not met, the control circuit 150 may also reduce the nominal operating frequency so as to ensure safe operation of the electronic device. In some embodiments, other operating parameters of the integrated may be adjusted in response to detecting that the predefined frequency margin is not met, e.g. an operating voltage or a body bias.

In some embodiments, the control circuit 150 may also be provided with further signal inputs, e.g. for receiving external control signals. Such external control signals may trigger the evaluation, e.g. in an idle phase of the integrated circuit.

Accordingly, providing the circuitry with the error detection circuits 200 and the control circuit 150, timing margins of the integrated circuit including the signal path 110 may be evaluated in an efficient and reliable manner. Specifically, the evaluation may be done on the basis of the actual circuit elements in the signal paths 110 as monitored by the error detection circuit 200. As compared to other concepts, e.g. on the basis of a replica circuit, this provides more reliability and induces less circuit overhead. Further, the evaluation may be done during normal operation of the electronic device, e.g. during a start-up phase or initialization phase.

In some embodiments, the evaluation of timing margins may be accomplished without affecting payload signals on the signal paths 110 by using a specific type of error detector 210 which predicts an error before the error actually occurs. This will be further explained in connection with FIGS. 6 and 8. In such a case, the evaluation may be done at any time during normal operation of the electronic device, e.g. on the basis of regular time intervals. However, it is to be understood that some applications may be sensitive to a frequency increase of the operating clock signal CLK or that frequency deviations may be prohibited by system specifications. For example, this may be the case if interfaces of the electronic device deliver data at a fixed rate. In other cases, e.g. in case of transceivers which have an interface to other devices or components via FIFO-buffers (FIFO: "First In First Out") or a shared memory and have individual transmit clock generators, frequency deviations in digital circuit clocks may be acceptable. Similarly, the temporary increase in the frequency of the operating clock signal may be no problem if data is transmitted on the basis of the increased frequency and a receiver uses a clock-data-recovery circuit and allows for locking to the altered frequency. Generally, smaller frequency increments will have less tendency to disturb normal operation of the electronic device.

Accordingly, in some embodiments the frequency increment may be limited to a maximum value in the order of a frequency margin as specified for the integrated circuit, e.g. in a data sheet or the like. As mentioned above, rather than evaluating an absolute value of the frequency increment, the frequency increment may be further evaluated by comparison to a predefined frequency margin. In this case, limiting the frequency increment to a maximum value allows for an efficient and reliable evaluation. At the same time disturbances of normal operation of the electronic device due to frequency alterations are avoided or reduced.

In some embodiments, e.g. if the system in which the electronic device is operated does not tolerate frequency alterations, the evaluation of the timing margin may be accomplished in a dedicated idle period.

It is to be understood that in the circuitry of FIG. 1, the control circuit 150, the frequency control register 160 and/or the clock signal source 120 may be included in the same integrated circuit with the signal paths 110. Alternatively, the clock signal source 120, the frequency control register 160, and/or the control circuit 150 may be external components. Further, it is to be understood that the integrated circuit 110 may actually include further signal paths and that not all of these signal paths need to be monitored by the error detection circuit 200. Further, the error detection circuit may include multiple error detectors 210 coupled to the same signal path. The error detectors 210 are typically positioned in such a way that the most critical signal path portions in the integrated circuit are covered and monitored by the error detection circuit 200.

Figure 2:
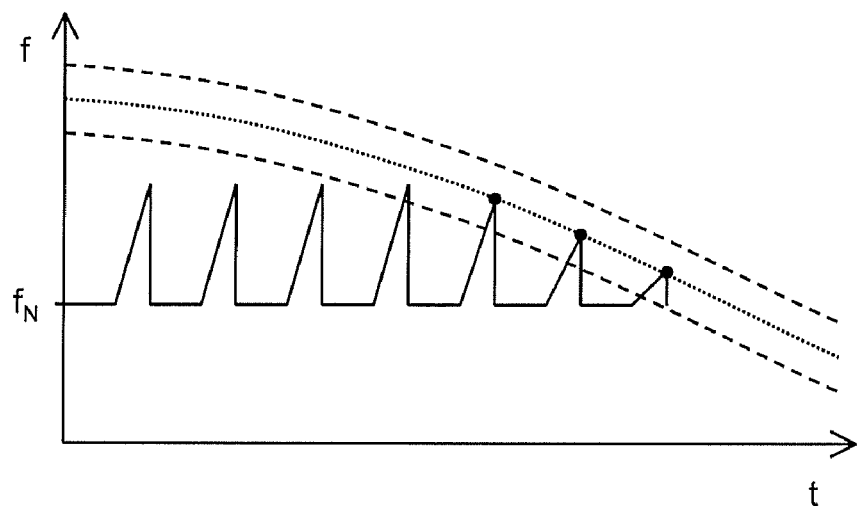
FIG. 2 schematically illustrates an exemplary process of increasing an operating frequency of an integrated circuit according to an embodiment of the invention.
Figure 3:
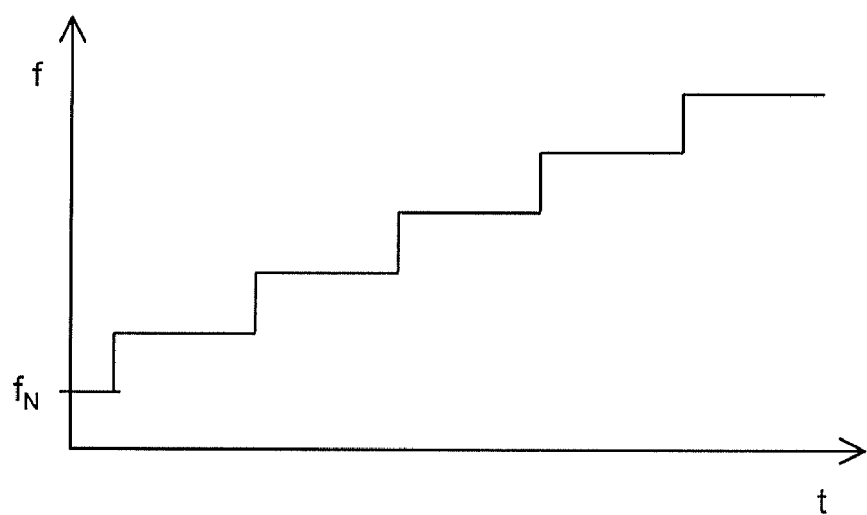
FIG. 3 schematically illustrates further details in the process of FIG. 2.

FIGS. 2 and 3 schematically illustrate a process of increasing the frequency in accordance with the concepts as described above. FIG. 2 illustrates the course of the frequency of the operating clock signal CLK over a period of time which substantially corresponds to a typical lifespan of the integrated circuit. The frequency of the operating clock signal CLK is shown by a solid line, and the nominal operating frequency is denoted by $f_N$. Further, a maximum operating frequency of the integrated circuit is shown by a dotted line, and variations of this maximum frequency due to a manufacturing process of the integrated circuit are illustrated by dashed lines.

As shown in FIG. 2, the frequency of the operating clock signal CLK is regularly increased starting from the nominal operating frequency $f_N$. Specifically, the frequency is increased up to a maximum frequency or until an error is detected (which is the case when the course of the frequency of the operating clock signal CLK as shown by the solid line crosses the course of the maximum frequency as shown by the dotted line). In FIG. 2, points at which errors are detected are illustrated by solid dots. As can be seen, when an error is detected, the frequency is not further increased beyond the maximum allowable frequency. In this way, malfunctions or damages of the integrated circuit may be avoided.

As further shown in FIG. 2, the timing margins may be evaluated several times during the lifespan of the integrated circuit. Here, it is to be understood that the drawing of FIG. 2 is not to scale and that the actual number of evaluations may be significantly larger than illustrated in FIG. 2. Further, although the illustration of FIG. 2 indicates an evaluation in regular time intervals, it is to be understood that in some embodiments the evaluation may be accomplished on an irregular time basis, e.g. triggered by specific events, such as activation of the electronic device, deactivation of the electronic device, external trigger signals, or the like. In some embodiments, event-triggered evaluations may be combined with evaluations on a regular time basis. Further, evaluations may be scheduled to occur more frequently over the course of time, thereby obtaining an evaluation density which increases as the integrated circuit ages.

FIG. 3 schematically illustrates further details in the process of FIG. 2. In FIG. 3, a portion of a frequency ramp starting from the nominal frequency $f_N$ is illustrated. Further, FIG. 3 includes a schematic representation of the clock signal CLK. As shown in FIG. 3, the frequency of the clock signal is progressively increased from the nominal frequency $f_N$, and the increase occurs over several clock cycles of the operating clock signal CLK. In fact, due to the frequency of the operating signal CLK being digitally controlled, the frequency increases in a step-like manner. However, it is to be understood that the progressive increase of the frequency may also be more or less continuous, e.g. by using sufficiently small step sizes or analogue frequency control functions. Further, the slope of the frequency ramp or the step size may be uniform or may vary in the course of the frequency ramp. For example a larger slope or step size may be selected in a lower portion of the frequency ramp, and a smaller slope or step size may be selected in an upper portion of the frequency ramp. In this way, since the occurrence of an error is to be expected in the upper portion of the frequency ramp, an improved accuracy can be obtained for the evaluation without extending the time intervals needed for the evaluation.

Figure 4:
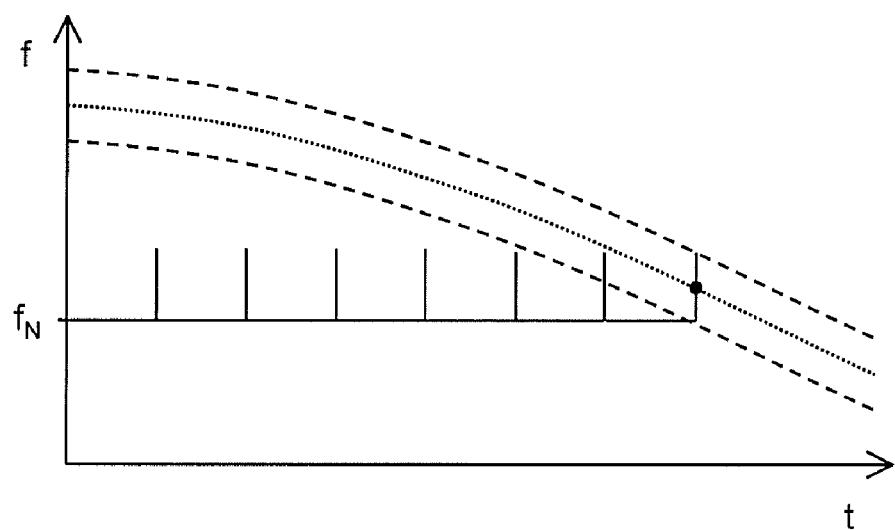
FIG. 4 schematically illustrates a further process of increasing an operating frequency in an integrated circuit according to an embodiment of the invention.

FIG. 4 schematically illustrate a further process of temporarily increasing the frequency of the operating clock signal CLK. As in FIGS. 2 and 3, the frequency of the operating clock signal is shown by a solid line. Further, the course of the maximum allowable frequency is shown by a dotted line and the variations of this course are illustrated by dashed lines. A point at which an error is detected in the integrated circuit is illustrated by a solid dot and corresponds to the position at which the course of the frequency of the operating clock signal CLK crosses the course of the maximum allowable frequency.

Figure 5:
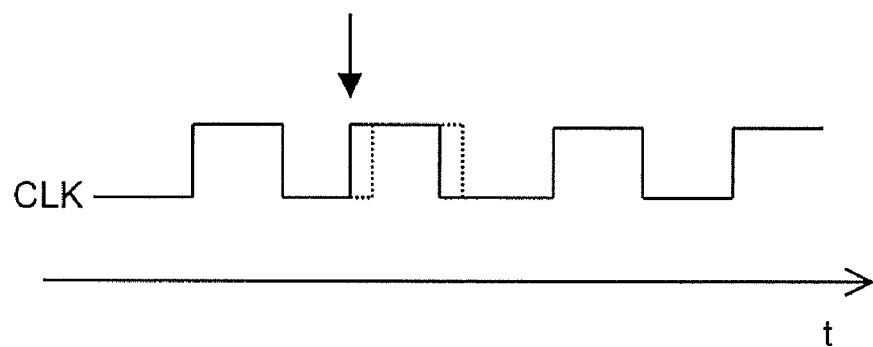
FIG. 5 schematically illustrates further details in the process of FIG. 4.

As compared to the situation of FIGS. 2 and 3, in which the frequency of the operating clock signal CLK is progressively increased over multiple clock cycles, the process of FIG. 4 involves increasing the frequency by phase-shifting a single clock edge of the clock signal CLK. This is further illustrated in FIG. 5. As shown in FIG. 5, a clock pulse of the clock signal CLK is shifted towards the previous clock pulse at the position of the vertical arrow. The position of the unshifted clock pulse is illustrated by a dotted line. As can be taken from the illustration of FIG. 5 such a shifting of the clock pulse corresponds to increasing the frequency of the clock signal CLK for only a single clock cycle. As an alternative to the illustrated process of shifting one single clock pulse, only a single clock edge may be shifted, e.g. the leading edge of the clock pulse, or a number of clock edges or clock pulses may be shifted.

According to an embodiment, the shifting of the clock edge as illustrated in FIG. 5 may be accomplished by an selectively controllable frequency divider in the output signal path of the clock signal source 120. That is to say, in normal operation, the clock signal source 120 supplies the operating clock signal with the divided frequency, and upon receiving a respective control signal from the control circuit 150, the frequency divider will be temporarily deactivated or bypassed, thereby increasing the frequency of the operating clock signal CLK. As an alternative to bypassing or deactivating the frequency divider, a frequency divisor of the frequency divider may be selectively adjusted.

In other embodiments, the clock edge may be shifted in a different way, e.g. by providing a selectively controllable delay element in the output signal path of the clock signal source 120, such as a controllable phase shifter or a controllable phase rotator. Further, it is to be understood that the concepts of increasing the frequency of the operating clock signal CLK by phase-shifting of a single clock pulse as explained in connection with FIGS. 4 and 5 may also be combined with the progressive increase as explained in connection with FIGS. 2 and 3. Further, more sophisticated strategies may be used for evaluating the point at which an error occurs, e.g. a binary search. For example, binary search could be implemented by starting with a frequency increment from an initial frequency interval which is iteratively subdivided depending on whether an error is detected or not.

Figure 6:
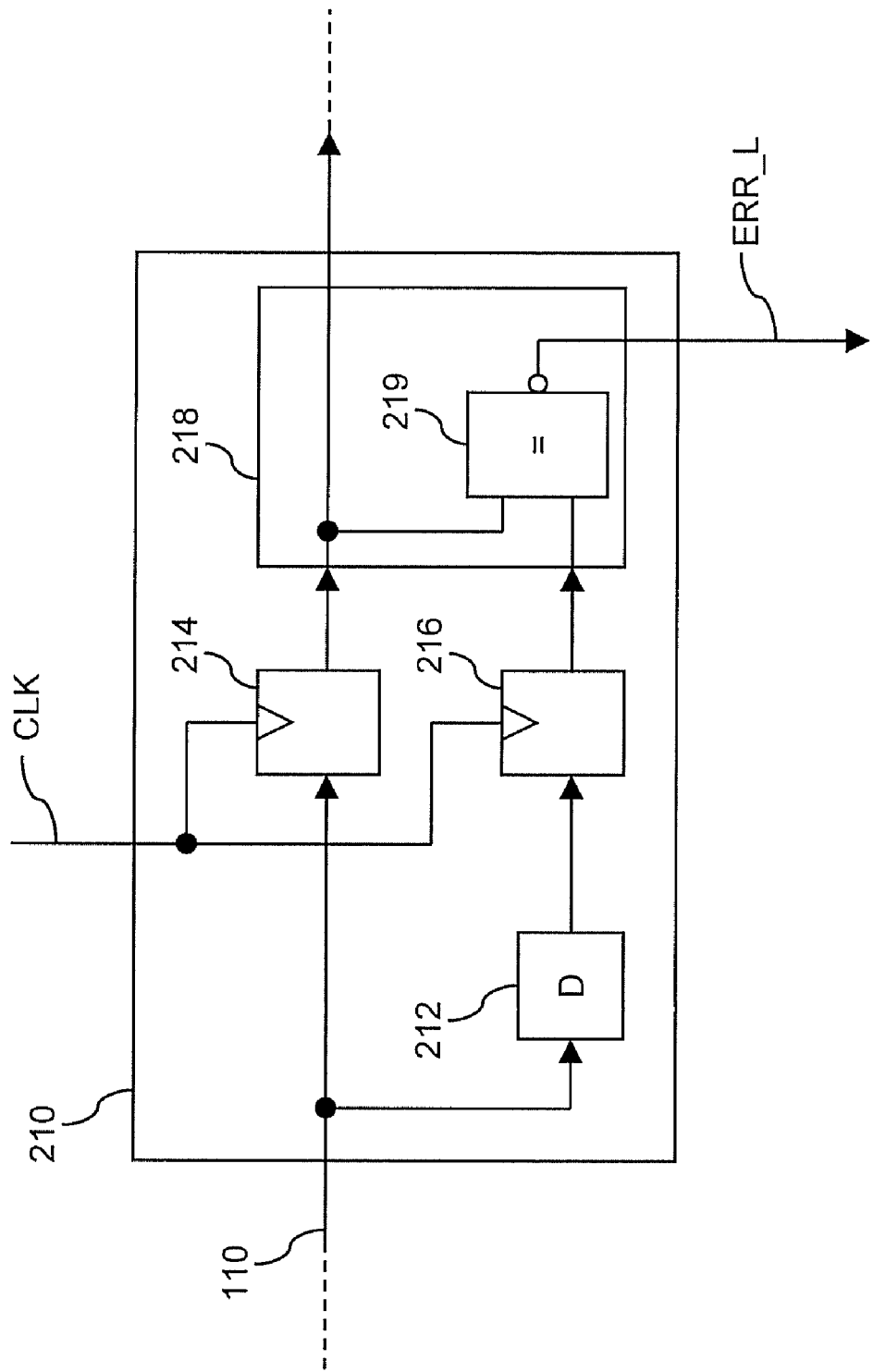
FIG. 6 schematically illustrates an error detector in the circuitry of FIG. 1.

FIG. 6 schematically illustrates an implementation of an error detector 210 in the circuitry of FIG. 1. In the illustrated implementation, the error detector 210 is configured to predict an error in the signal path 110 before the error actually occurs. For this purpose, the error detector 210 includes two error prediction flip-flops 214, 216. The incoming signal on the signal path 110 is supplied to the first error prediction flip-flop 214 and stored on the basis of the operating clock signal CLK. Further, the incoming signal on the signal path 110 is supplied to the second error prediction flip-flop 216 via a delay element 212 and stored on the basis of the operating clock signal CLK. Due to the delay element 212, the process of storing the incoming signal in the second error prediction flip-flop 216 is more critical with respect to the signal timing. That is to say, if the frequency of the operating clock signal CLK comes close to the maximum allowable frequency, the first error prediction flip-flop 214 will still store the correct value, whereas the second error prediction flip-flop 216 is no longer capable of storing the correct value. The output signals of the error prediction flip-flops 214, 216 are supplied to an error evaluation circuit 218, in which the output signals are compared to each other by a comparator 219. The output signal of the comparator 219 indicates whether there is a deviation between the output signals of the error prediction flip-flops 214, 216 and forms the local error signal ERR_L.

The output signal of the first error prediction flip-flop 214 is further passed through the error evaluation circuit 218 and forms an output signal of the error detector 210. The signal path 110 thus extends through the error detector 210 and, due to the first error prediction flip-flop 210 being less sensitive to an excessive frequency of the operating clock signal CLK, is not affected by the error detection process. Accordingly, the error detector 210 is capable of predicting an error in the signal path 110 before the error actually occurs.

Figure 7:
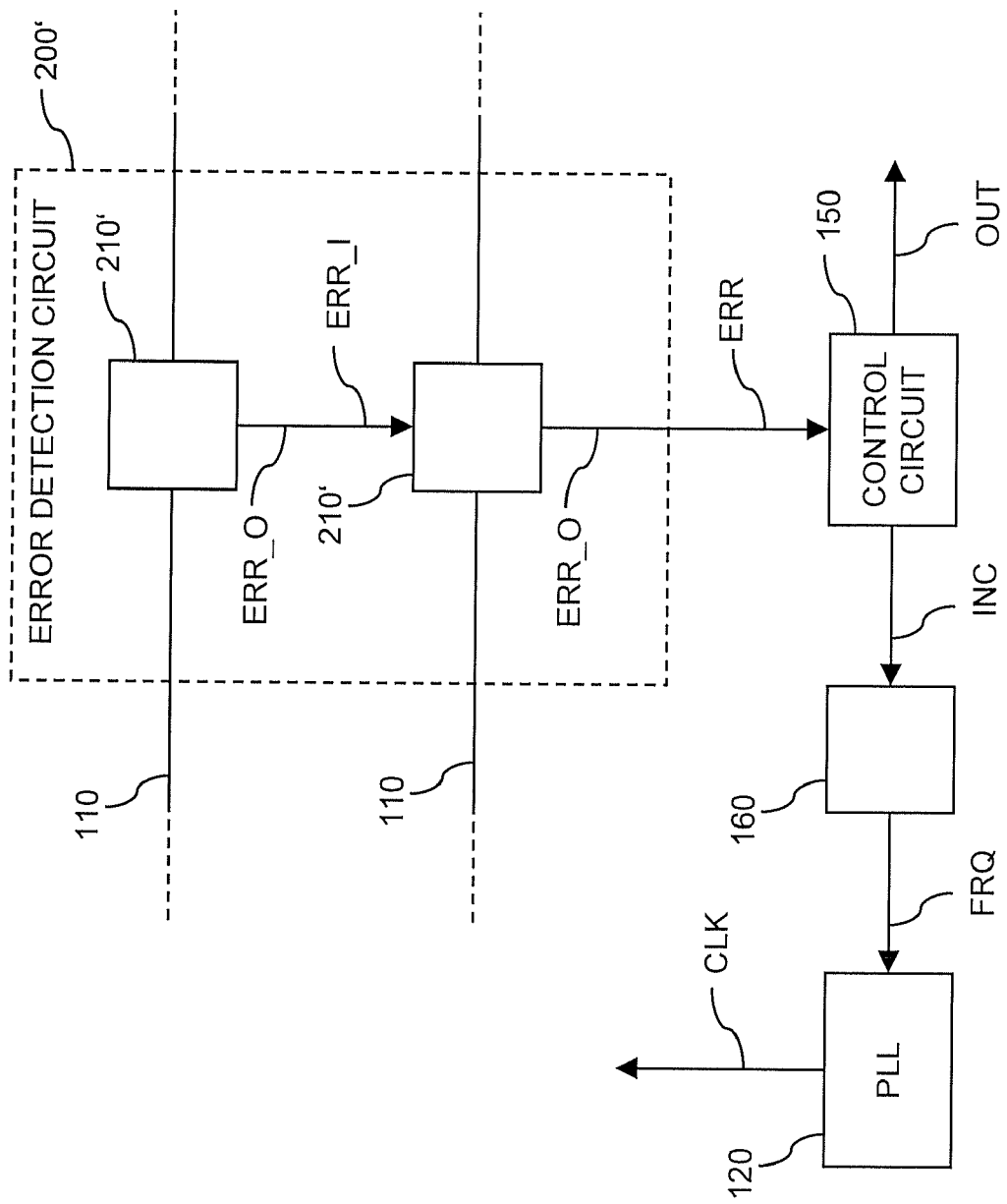
FIG. 7 schematically illustrates circuitry in an electronic device according to a further embodiment of the invention.

As mentioned above, a typical integrated circuit may comprise a large number of signal paths to be monitored by the error detection circuit, which means that a plurality of error detectors and their corresponding individual local error signals need to be evaluated. In the circuitry of FIG. 1, this is accomplished by supplying the individual local error signals ERR_L to the combination logic 250. A further approach to address this issue is shown in FIG. 7. In FIG. 7, components which are similar to those of FIG. 1 have been designated by the same reference signs. Further details of these components can thus be taken from the corresponding description with respect to FIG. 1.

As illustrated, the circuitry of FIG. 7 includes an error detection circuit 200' which is based on error detectors 210' which are connected in a chain configuration. That is to say, an output error signal ERR_O of one error detector 210' of the chain configuration is supplied as an error input signal ERR_I to a next error detector 210' of the chain configuration. An error output signal ERR_O of the last error detector 210' of the chain configuration is supplied as the error signal ERR to the control circuit 150 and processed as described in connection with FIGS. 1 to 5. In the error detection circuit 200', the error information is thus propagated from one error detector 210' to the next error detector 210', and a suitable combination of the error information received from the previous error detector 210' in the chain configuration and locally generated error information is accomplished within each error detector 210'. Specifically in the case of a large number of error detectors this provides a highly efficient way of collecting the error information from different positions in the integrated circuit.

Also in case of the circuitry of FIG. 7, it is to be understood that the clock signal source 120, the control circuit 150, and the frequency controlled register 160 may be included in the same integrated circuit with the signal paths 110 or may be external components. Further, it is to be understood that the integrated circuit may actually comprise further signal paths which are not monitored by the error detection circuit 200'. Finally, it is to be understood that the concepts of FIG. 1 and of FIG. 7 may be combined with each other by having both types of error detection circuit 200, 200' in a single integrated circuit. The output error signal of the error detection circuit 200' could then be supplied as a further input signal to the combination circuit 250 of the error detection 200, or a dedicated combination circuit could be used to combine the output error signals of the different error detection circuits 200, 200'.

Figure 8:
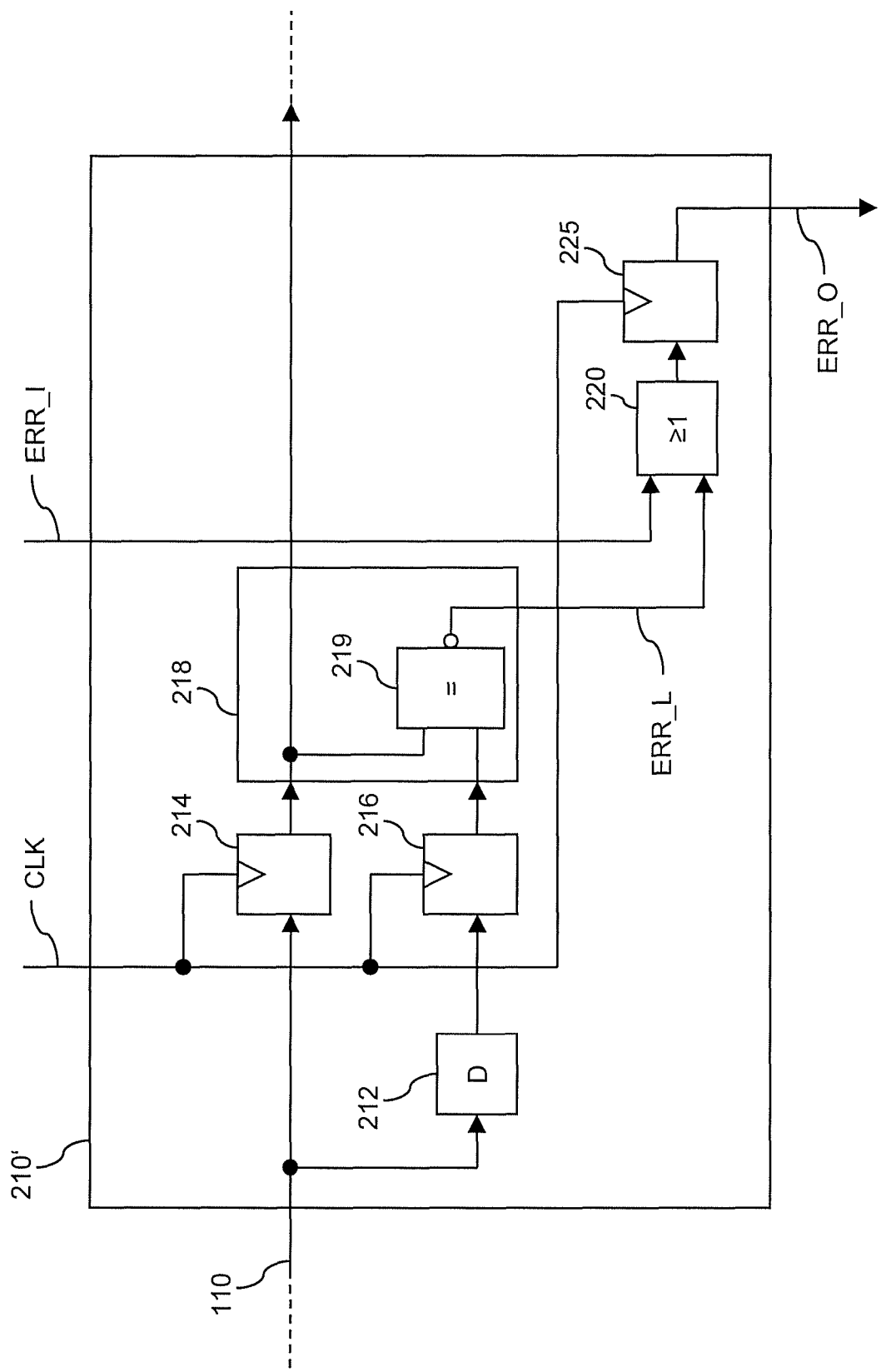
FIG. 8 schematically illustrates an error detector in the circuitry of FIG. 7.

FIG. 8 schematically illustrates an implementation of the error detectors 210' in the circuitry of FIG. 7. Like the error detector 210 illustrated in FIG. 6, the error detector 210' comprises a first error detection flip-flop 214, a second error detection flip-flop 216, a delay element 212, and an error evaluation circuit 218 with a comparator 219. Further details concerning these components, their operation and interrelation can be taken from the corresponding descriptions in connection with FIG. 6.

Further, the error detector 210' includes a combination element 220, implemented by a logic OR-gate, and a register 225. The error input signal ERR_I received from the previous error detector in the chain configuration is supplied as a first input to the combination element 220. A second input of the combination element 220 is formed by the local error signal ERR_L as output by the error evaluation circuit 218. The output signal of the combination 220 is supplied to the register 225 and stored on the basis of the operating clock signal CLK. An output signal of the register 225 forms the error output signal ERR_O of the error detector 210'.

When connecting a plurality of the error detectors 210' having the above structure in the chain configuration as illustrated in FIG. 7, the registers 225 of the individual error detectors 210' will be connected in series, thereby forming a shift-register type structure. The output of the shift-register type structure is used for generating the input signal to the control circuit 150. In some embodiments, it is also possible to combine the output signals of different shift-register type structures using a combination logic as illustrated in FIG. 1 or to combine the output signal of an error detection circuit adding a configuration as illustrated in FIG. 1 with the output signal of an error detection circuit having the configuration as illustrated in FIG. 7.

Figure 9:
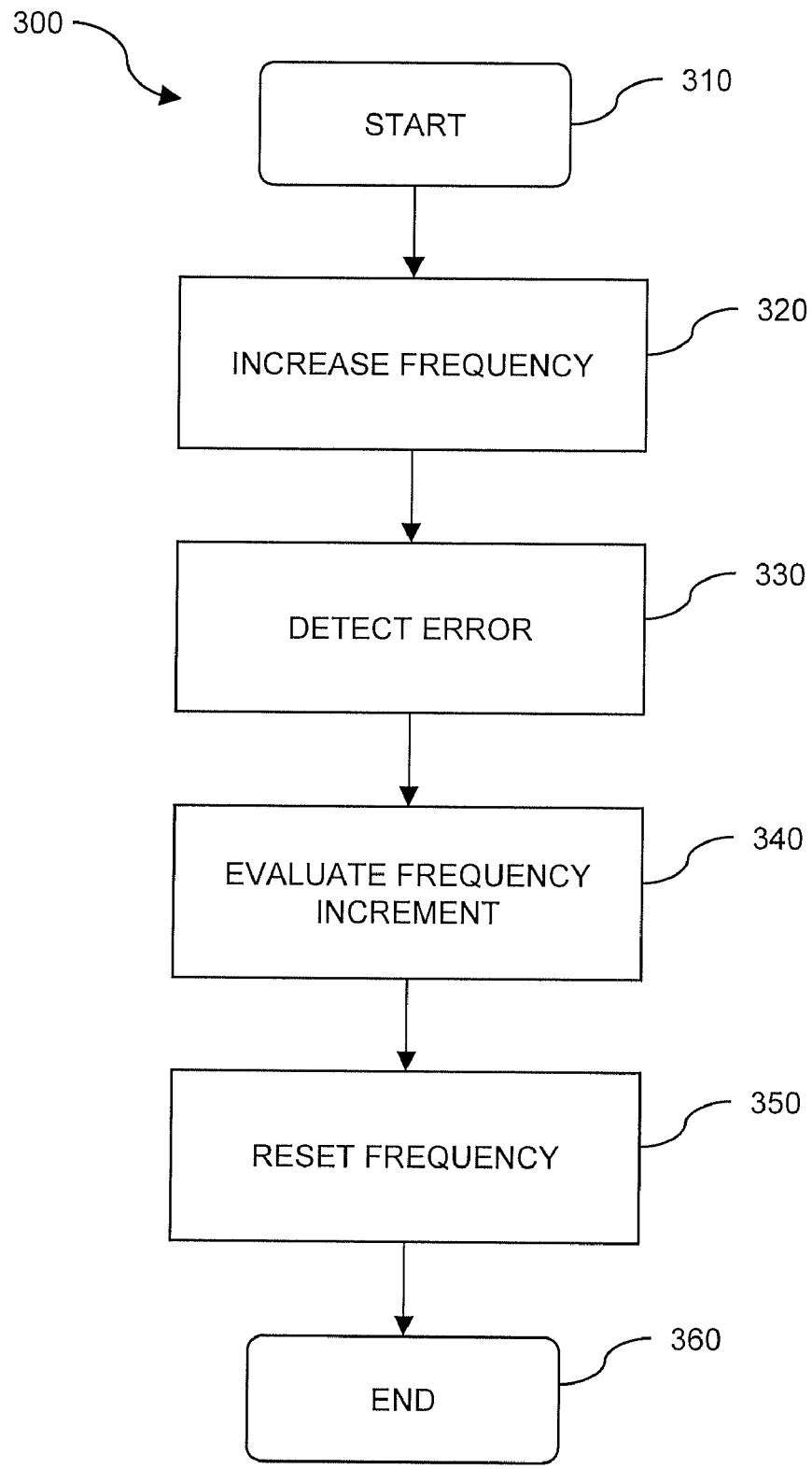
FIG. 9 shows a flow-chart for illustrating a method according to an embodiment of the invention.

FIG. 9 shows a flow-chart form illustrating a method 300 of evaluating timing margins in an integrated circuit in accordance with the above concepts. It is to be understood that the flow chart of FIG. 9 is merely illustrative and that the illustrated method steps may be rearranged or modified as appropriate.

In step 310, the frequency of the operating clock signal of the integrated circuit is increased. This may be accomplished as explained in connection with FIGS. 2 to 5. That is to say, the frequency may be increased progressively over a plurality of clock cycles until a maximum frequency increment is reached or until an error is detected in the integrated circuit. In addition or alternatively, the frequency may be increased by shifting a single clock pulse of the operating clock signal, e.g. using selective frequency division or selective delaying of the operating clock signal.

In step 320, an error is detected in the integrated circuit. As explained above, this may involve predicting the error before the error actually occurs. In some embodiments, if no error is detected in step 320, the method 300 may return to step 310 so as to further increase the frequency. In other embodiments, the steps 310 and 320 may be iterated in a different manner, e.g. by starting with a large increase of the frequency and then iteratively reducing the frequency increase until no error is detected at step 320.

At step 330, the frequency increment at which the error is detected is evaluated. This may involve evaluating an absolute value of the frequency increment or comparing the frequency increment to a threshold value, e.g. to a predefined frequency margin. If the comparison of the frequency increment to the predefined frequency margin indicates that the evaluated frequency increment is less than the predefined frequency margin, a warning signal may be generated and/or the nominal frequency of the operating clock signal may be reduced.

At step 340, the frequency is reset to the nominal frequency.

The method 300 as illustrated in FIG. 9 may be initiated in regular time intervals during normal operation of the integrated circuit. Further, the method may be triggered by a predefined event, such as activating an electronic device with the integrated circuit, deactivating an electronic device with the integrated circuit, external trigger signals, or the like.

It is to be understood that the above described embodiment and examples have been provided only for the purpose of illustrating the present invention. As will be apparent to the skilled person, the invention may be applied in a variety of different ways, which may deviate from the above-described embodiments. For example, the concepts as described above are not limited to using error detectors capable of predicting an error. Rather, types of error detectors may be used which detect errors as they actually occur. Further, different types of error detection circuit may be used. For example, an error detection circuit could be used which is based upon supplying a predefined input to the integrated circuit and comparing an output in response thereto to an expected output. Further, the above concepts may be applied in different types of integrated circuits, electronic devices or electronic systems, including but not limited to: communication devices, transmitters, receivers, transceivers, processors, or the like.

What is claimed is:

1. An electronic device, comprising:
an integrated circuit configured to operate on the basis of an operating clock signal,
an error detection circuit, and
a control circuit coupled to the error detection circuit, the control circuit being configured to increase the frequency of the operating clock signal starting from a nominal operating frequency of the integrated circuit, to evaluate a frequency increment at which an error is detected by the error detection circuit, and to reset the frequency of the operating clock signal to said nominal frequency.

2. The electronic device according to claim 1,
wherein the error detection circuit is configured to predict the error before the error actually occurs.

3. The electronic device according to claim 1,
wherein the control circuit is configured to increase the frequency of the operating clock signal during normal operation of the integrated circuit.

4. The electronic device according to claim 1,
wherein the error detection circuit comprises an error prediction flip-flop coupled to a signal path of the integrated circuit.

5. The electronic device according to claim 1,
wherein the error detection circuit comprises a plurality of error detectors, each of the error detectors being coupled to a respective signal path of the integrated circuit.

6. The electronic device according to claim 5, comprising:
a combination logic coupled between the plurality of error detectors and the control circuit.

7. The electronic device according to claim 5,
wherein the plurality of error detectors are connected in a chain configuration.

8. The electronic device according to claim 1,
wherein the control circuit is configured to progressively increase the frequency of the operating clock signal over a plurality of clock cycles.

9. The electronic device according to claim 1,
wherein the control circuit is configured to increase the frequency of the operating clock signal by phase shifting at least a clock edge of the clock signal.

10. The electronic device according to claim 1,
wherein the control circuit is configured to compare the evaluated frequency increment to a predefined frequency margin.

11. The electronic device according to claim 10,
wherein the control circuit is configured to reduce the nominal frequency if the evaluated frequency increment is less than the predefined frequency margin.

12. The electronic device according to claim 10,
wherein the control circuit is configured to output a warning signal if the evaluated frequency increment is less than the predefined frequency margin.

13. The electronic device according to claim 1, comprising:
a digital clock signal source configured to generate the operating clock signal.

14. An integrated circuit, comprising:
a digital clock signal source configured to generate an operating clock signal of the integrated circuit,
an error detection circuit, and
a control circuit coupled to the error detection circuit, the control circuit being configured to increase the frequency of the operating clock signal starting from a nominal operating frequency of the integrated circuit, to evaluate a frequency increment at which an error is detected by the error detection circuit, and to reset the frequency of the operating clock signal to said nominal frequency.

15. The integrated circuit according to claim 14, comprising:
a frequency control register coupled to the digital clock generator and configured to supply a frequency control signal to the digital clock signal source.

16. A method, comprising:
increasing the frequency of an operating clock signal in an integrated circuit starting from a nominal operating frequency of the integrated circuit,
detecting whether an error occurs in the integrated circuit,
evaluating a frequency increment at which an error occurs in the integrated circuit, and
resetting the frequency of the operating clock signal to said nominal operating frequency.

17. The method according to claim 16, comprising:
predicting the error before the error actually occurs.

18. The method according to claim 16, comprising:
increasing the frequency of the operating clock signal during normal operation of the integrated circuit.

19. The method according to claim 16, comprising:
increasing the frequency of the operating clock signal in predefined time intervals.

20. The method according to claim 16, comprising:
increasing the frequency of the operating clock signal in response to a triggering event.

21. The method according to claim 16, comprising:
comparing the evaluated frequency increment to a predefined frequency margin.

22. The method according to claim 21, comprising:
reducing the nominal operating frequency if the evaluated frequency increment is less than the predefined frequency margin.

23. The method according to claim 21,
outputting a warning signal if the evaluated frequency increment is less than the predefined frequency margin.

24. The method according to claim 16, comprising:
progressively increasing the frequency of the operating clock signal over a plurality of clock cycles.

25. The method according to claim 16, comprising:
increasing the frequency of the operating clock signal by phase shifting at least a clock edge of the clock signal.

* * * * *